(12) United States Patent
Fischer et al.

(10) Patent No.: US 6,366,525 B2
(45) Date of Patent: Apr. 2, 2002

(54) SEMICONDUCTOR MEMORY OF THE DYNAMIC RANDOM ACCESS TYPE (DRAM) AND METHOD FOR ACTUATING A MEMORY CELL

(75) Inventors: Helmut Fischer, Taufkirchen; Thoralf Grätz, Dresden, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/739,543

(22) Filed: Dec. 15, 2000

(30) Foreign Application Priority Data

Dec. 15, 1999 (DE) .......................................... 199 60 558

(51) Int. Cl.$^7$ ................................................. G11C 7/00
(52) U.S. Cl. ..................................... 365/230.06; 365/51
(58) Field of Search ............................. 365/230.06, 51, 365/63, 189.05, 230.08

(56) References Cited

U.S. PATENT DOCUMENTS 4,195,357 A    3/1980  Kuo et al.
4,943,962 A  *  7/1990  Imamiya et al. ....... 365/230.08

OTHER PUBLICATIONS

Edmund A. Reese et al.: "A 4K×8 Dynamic RAM with Self–Refresh", IEEE Journal of Solid–State Circuits, vol. SC–16, No. 5, Oct. 1981, pp. 479–487.

* cited by examiner

Primary Examiner—Terrell W. Fears
(74) Attorney, Agent, or Firm—Herbert L. Lerner; Laurence A. Greenberg; Werner H. Stemer

(57) ABSTRACT

A semiconductor memory of the dynamic random access type (DRAM) includes memory cells combined in addressable units of bit lines and word lines. Each memory cell array is allocated a row decoder for selection of one of the word lines and a column decoder for selection of one of the bit lines, in the memory cell array. The row decoder is connected to a row selection signal line for transmission of a selection signal. The row decoder is disposed at an edge of the memory cell array allocated thereto, and between the memory cell arrays. The column decoder is connected to the row selection signal line. The column decoder is disposed on the outer edge area both of the memory cell array allocated thereto and of the memory field. A method for actuating a memory cell in such a semiconductor memory is also provided.

4 Claims, 1 Drawing Sheet

SEMICONDUCTOR MEMORY OF THE DYNAMIC RANDOM ACCESS TYPE (DRAM) AND METHOD FOR ACTUATING A MEMORY CELL

BACKGROUND OF THE INVENTION

Field of the Invention

The invention relates to a semiconductor memory of the dynamic random access type (DRAM), having memory cells disposed in at least four matrix memory cell arrays in a memory field. The memory cells are combined in addressable units of bit lines and word lines. Each memory cell array is allocated a row decoder for selection of one of the word lines in the memory cell array, and a column decoder for selection of one of the bit lines in the memory cell array. The row decoders in the at least four memory cell arrays for selection of one of the word lines are connected to a row selection signal line for transmission of a row selection signal. The invention also relates to a method for actuating a memory cell in such a semiconductor memory.

Modern semiconductor memories of the dynamic random access type (DRAM) require more area on semiconductor chips, despite the fact that structures for the rapidly increasing memory capacities are becoming smaller, and the memory cell fields are thus becoming larger. However, the area requirement is associated with considerable production costs. Apart from the memory cell fields, a not insignificant proportion of the area of a semiconductor memory chip is occupied by control, address and data lines, some of which are disposed alongside those fields and are becoming broader with the memory capacity of the semiconductor memory, and by control devices which are required for operation of the data memory.

A literature reference entitled: "A 4 k×8 Dynamic RAM with Self-Refresh", by E. Reese, et. al., in IEEE Journal of Solid-State Circuits, volume SC-16, No. 5, October 1981, pages 479 to 487, describes a 64 k semiconductor memory in which the memory cell field includes four memory cell arrays. Row and column decoders are disposed on different sides of the memory cell arrays. Both the column addresses and data are transmitted in multiplexed form on the internal bus. A separate bus is available to provide the column addresses.

U.S. Pat. No. 4,195,357 discloses a semiconductor memory in which the first 8 bits of an address in a memory cell and the next 8 bits of the address of the memory cell are applied after external multiplexing. A row address latch is available within the integrated semiconductor memory for the first 8 bits, and a column address latch is available for the next 8 bits.

SUMMARY OF THE INVENTION

It is accordingly an object of the invention to provide a semiconductor memory of the dynamic random access type (DRAM) and a method for actuating a memory cell, which overcome the hereinafore-mentioned disadvantages of the heretofore-known devices and methods of this general type and in which more area is available for memory cells.

With the foregoing and other objects in view there is provided, in accordance with the invention, a semiconductor memory of the dynamic random access type, comprising memory cells combined in addressable units of bit lines and word lines. The memory cells are disposed in at least four matrix memory cell arrays in a memory field. The memory cell arrays have outer edge areas and the memory field has an edge area. Each of the memory cell arrays has two sides and each of the sides is disposed opposite one side of another of the memory cell arrays. Row decoders are each assigned to a respective one of the memory cell arrays for selection of one of the word lines in the memory cell array, and column decoders are each assigned to a respective one of the memory cell arrays for selection of one of the bit lines in the memory cell array. The column decoders are each disposed at the outer edge area of the assigned memory cell array and at the edge area of the memory field. A row selection signal line is provided for transmission of a row selection signal. The row selection signal line is connected to the row decoders in the at least four memory cell arrays for selection of one of the word lines. The row selection signal line and the row decoders are disposed between respective opposite sides of the memory cell arrays. The column decoders for selection of one of the bit lines in the assigned memory cell arrays are connected to the row selection signal line for transmission of a column selection signal.

The invention proposes the possibility of saving a complete data bus, namely the column selection signal line (COLUMN), which is generally disposed at right angles to the row selection signal line (ROW), by using the row selection signal line for two purposes. This releases considerable surface areas of the chip, as a result of which the memory cell fields can be further enlarged or the structures made smaller, thus leading to cost savings.

In accordance with a concomitant mode of the invention, the row decoder is constructed in such a way that the row selection signal which is transmitted to it through the row selection signal line can be stored. This makes it possible for the row selection signal (ROW address) to be transmitted first of all on the row selection signal line, after which the column selection signal (COLUMN address) can be transmitted on the same row selection signal line. The memory cells can thus be actuated together with the temporarily stored row selection signal.

With the objects of the invention in view, there is also provided a method for actuating a memory cell disposed in such a semiconductor memory of the dynamic random access type (DRAM), which comprises transmitting a row selection signal to a row decoder assigned to a memory cell array for selection of a word line, and transmitting a column selection signal to a column decoder assigned to the memory cell array for selection of a bit line, at mutually different times through a selection signal line.

Other features which are considered as characteristic for the invention are set forth in the appended claims.

Although the invention is illustrated and described herein as embodied in a semiconductor memory of the dynamic random access type (DRAM) and a method for actuating a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
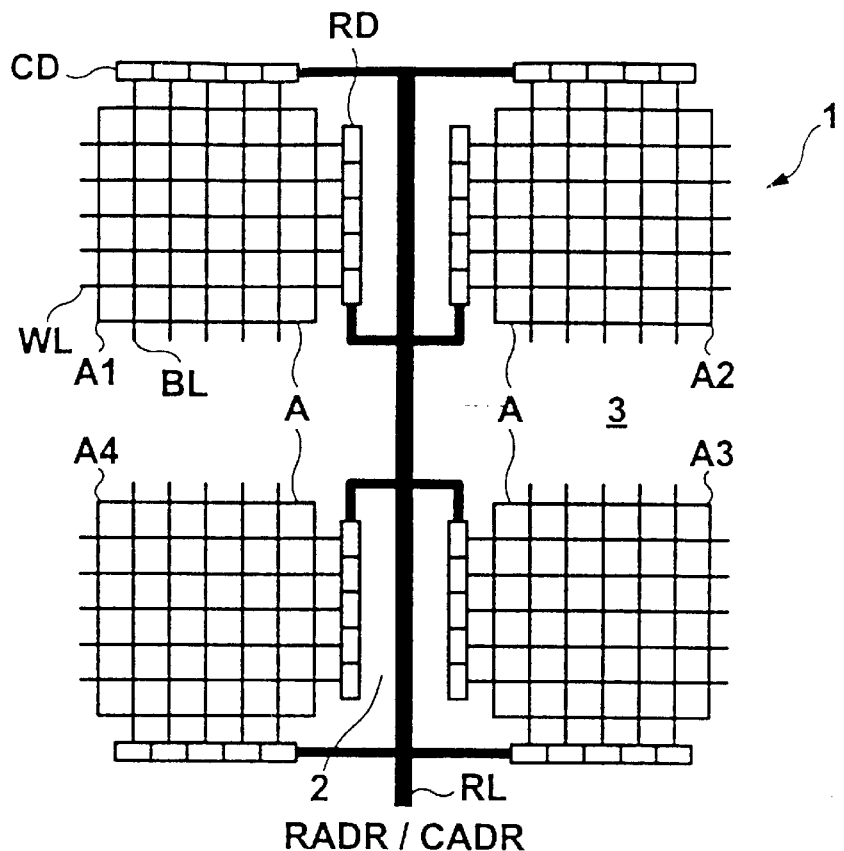
FIG. 1 is a schematic illustration of a preferred exemplary embodiment of a dynamic random access type (DRAM) semiconductor memory according to the invention, having only one selection signal line.
Figure 2:
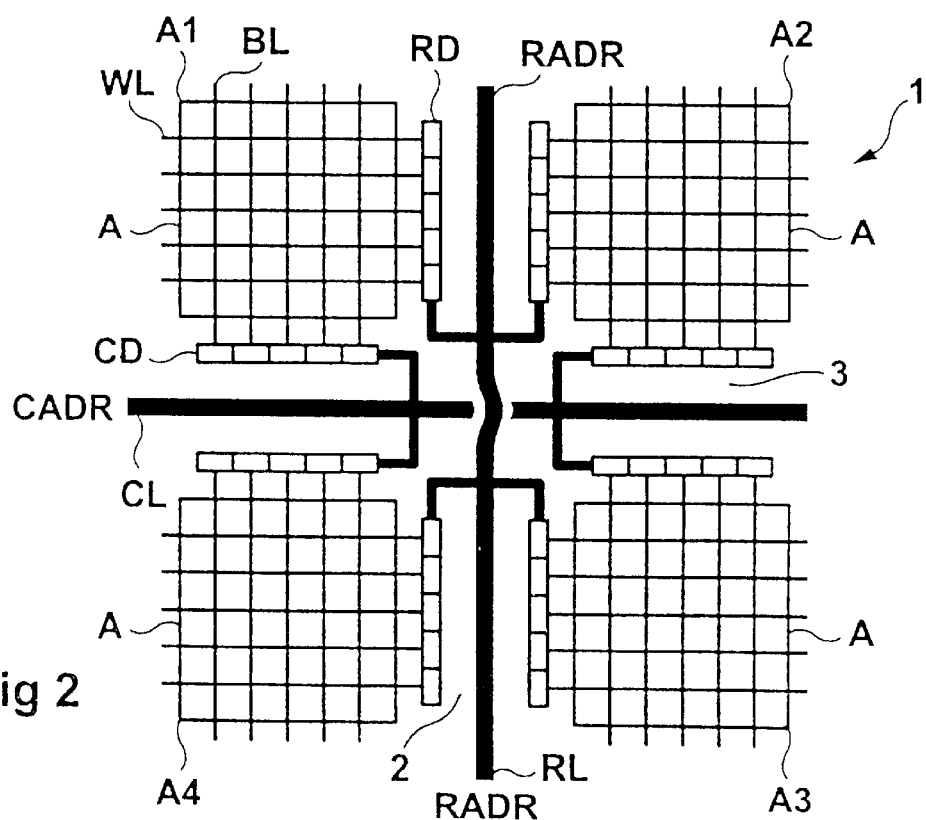
FIG. 2 is a schematic illustration of a known semiconductor memory of the dynamic random access type (DRAM).

Referring now to the figures of the drawings in detail and first, particularly, to FIG. 1 thereof, there is seen a dynamic random access type (DRAM) semiconductor memory 1, according to the invention. FIG. 2 shows a conventional semiconductor memory (DRAM). The designations used herein apply analogously to identical parts, or to parts having an equivalent effect. Memory cells, which are not illustrated but each of which form a memory cell field A with four memory cell arrays A1 to A4, are disposed at intersections of word lines WL and bit lines BL in the memories in both illustrations. The memory cells used herein may be constructed in a known way.

In the past, the memory cells were actuated over the word lines WL and bit lines BL through the use of decoders (CD and RD), as is illustrated in FIG. 2. That was accomplished by transmitting column and row selection signals CADR and RADR over mutually separate column and row selection signal lines CL and RL to the column and row decoders CD and RD. Individual lines required for the selection signal lines for this purpose were routed between the individual memory cell arrays A1 to A4 in the memory field A. An area in which the column selection signal lines CL run is a so-called "trench" 3 and an area in which the row selection signal lines RL run is called a "rib" 2.

As is shown in FIG. 1, the invention results in the entire area occupied by the individual lines of the column selection signal line CL being saved. The illustrated configuration of the column decoders CD on outer areas of both the memory cell arrays A1 to A4 and the memory field A, instead of between the memory cell arrays (see FIG. 2) as in the past, allows the memory cell arrays, and thus the memory capacity of the semiconductor memory, to be enlarged accordingly, or the surface area required for the circuit to be reduced. This has a positive effect on the production costs, without needing to increase the circuit density or the chip surface area. The column and row selection signals CADR and RADR now just need to be transmitted to one another on the same line at different times. For this purpose, the row selection signals RADR are advantageously transmitted before the column selection signals CADR, or vice versa. The row selection signals RADR are then advantageously temporarily stored by the row decoder RD, so that the column selection signals CADR can be transmitted. For this purpose, the row decoders RD have an apparatus for temporary storage, for example a latch circuit or the like.

The row decoders RD and the row selection signal line RL run in a first direction. In the figures, the row decoders RD and the row selection signal line RL run in a first vertical direction. The column decoders CD and the column selection signal lines CL run in a different direction, essentially at right angles to the first. In the figures, the column decoders CD and the column selection signal lines CL are aligned horizontally. According to the invention, the row decoders RD are disposed between two mutually opposite sides of the memory cell arrays A1 and A2, or A4 and A3, in FIG. 1. The row selection signal line RL runs between them. There is thus no column decoder located between the memory cell arrays A1 and A4 or A2 and A3, that is to say between their opposite sides. In fact, the column decoders CD are located outside these intermediate spaces, on those edge zones of the memory cell arrays which point toward the outside of the chip.

In order to avoid collisions, a signal is advantageously generated which indicates whether or not any row or column selection signals are being applied to the decoders through the row selection signal line.

We claim:

1. A semiconductor memory of the dynamic random access type, comprising:
    memory cells combined in addressable units of bit lines and word lines;
    said memory cells disposed in at least four matrix memory cell arrays in a memory field, said memory cell arrays having outer edge areas and said memory field having an edge area;
    each of said memory cell arrays having two sides, each of said sides disposed opposite one side of another of said memory cell arrays;
    row decoders each assigned to a respective one of said memory cell arrays for selection of one of said word lines in said memory cell array, and column decoders each assigned to a respective one of said memory cell arrays for selection of one of said bit lines in said memory cell array;
    said column decoders each disposed at said outer edge area of said assigned memory cell array and at said edge area of said memory field;
    a row selection signal line for transmission of a row selection signal, said row selection signal line connected to said row decoders in said at least four memory cell arrays for selection of one of said word lines;
    said row selection signal line and said row decoders disposed between respective opposite sides of said memory cell arrays; and
    said column decoders for selection of one of said bit lines in said assigned memory cell arrays connected to said row selection signal line for transmission of a column selection signal.

2. The semiconductor memory according to claim 1, wherein said row decoders store the row selection signal transmitted thereto through said row selection signal line.

3. A method for actuating a memory cell disposed in a semiconductor memory according to claim 1, which comprises:
    transmitting the row selection signal to said row decoder assigned to one of said memory cell arrays for selection of said word line, and
    transmitting the column selection signal to said column decoder assigned to said memory cell array for selection of a bit line,
    at mutually different times through said row selection signal line.

4. The method according to claim 3, which further comprises storing the row selection signal transmitted to said row decoders through said row selection signal line, in said row decoders.

* * * * *